(12) United States Patent
Behammer et al.

(10) Patent No.: US 8,586,418 B2
(45) Date of Patent: Nov. 19, 2013

(54) METHOD FOR THE PRODUCTION OF AN ELECTRONIC COMPONENT AND ELECTRONIC COMPONENT PRODUCED ACCORDING TO THIS METHOD

(75) Inventors: Dag Behammer, Ulm (DE); Hermann Stieglauer, Blaustein (DE)

(73) Assignee: United Monolithic Semiconductors GmbH, Ulm (DE)

( * ) Notice: Subject to any disclaimer, the term of this patent is extended or adjusted under 35 U.S.C. 154(b) by 0 days.

(21) Appl. No.: 13/392,375

(22) PCT Filed: Sep. 20, 2010

(86) PCT No.: PCT/EP2010/063773
§ 371 (c)(1),
(2), (4) Date: Feb. 24, 2012

(87) PCT Pub. No.: WO2011/036112
PCT Pub. Date: Mar. 31, 2011

(65) Prior Publication Data
US 2012/0175764 A1    Jul. 12, 2012

(30) Foreign Application Priority Data
Sep. 23, 2009   (DE) .......................... 10 2009 044 086

(51) Int. Cl.
*H01L 23/34* (2006.01)
(52) U.S. Cl.
USPC 438/122; 257/706; 257/E23.08; 257/E21.509; 257/713; 257/751
(58) Field of Classification Search
USPC ............ 257/706, E23.08, E21.509, 713, 751, 257/E21.584, E23.141, 707, 766, 698
See application file for complete search history.

(56) References Cited

U.S. PATENT DOCUMENTS 5,027,189 A * 6/1991 Shannon et al. .............. 257/783
5,156,998 A   10/1992 Chi et al.
(Continued)

FOREIGN PATENT DOCUMENTS

| DE | 196 32 635 | 3/1997 |
| EP | 1 850 400 | 10/2007 |
| JP | 2-039569 | 2/1990 |

OTHER PUBLICATIONS

International Search Report of PCT/EP2010/063773, Mar. 18, 2011.
(Continued)

*Primary Examiner* — Chuong A Luu
*Assistant Examiner* — Rodolfo Fortich
(74) *Attorney, Agent, or Firm* — Collard & Roe, P.C.

(57) ABSTRACT

The invention relates to an electronic component having a circuit integrated on a semiconductor substrate, and a heat-conducting connection of the substrate by soldering using a carrier serving as a heat sink, wherein the invention proposes depositing a first, thicker Au layer (23) in the conventional back-side metallization of the substrate, thereafter a barrier coating (24), and, as the last layer, a thinner, second Au layer (25), wherein the material of the barrier coating is selected such that the barrier coating prevents the penetration by means of a diffusion barrier of Sn or AuSn from a liquid Au—Sn phase in the region of the second Au layer into the first Au layer (23) during the soldering process. The layer sequence of the back-side metallization is also deposited in the pass-through openings of the substrate, wherein the surface of the second Au layer comprises a reduced coatablity for the solder material due to the material diffused out of the barrier coating.

14 Claims, 3 Drawing Sheets

(56) References Cited

U.S. PATENT DOCUMENTS

| | | | |
|---|---|---|---|
| 5,483,092 A | | 1/1996 | Kosaki |
| 5,729,561 A | | 3/1998 | Hironaka |
| 7,339,267 B2 | | 3/2008 | Thompson et al. |
| 2001/0028113 A1 | * | 10/2001 | Kosaki et al. ............. 257/758 |
| 2003/0020174 A1 | | 1/2003 | Kohno |
| 2006/0270194 A1 | * | 11/2006 | Thompson et al. ......... 438/460 |

OTHER PUBLICATIONS

Costas Varmazis and Gerald S. D'Urso, "*How to Process the Backside of GaAs Wafers*," Henry Hendriks Process Engineering Group, M/A-COM Inc., Lowell, Mass.—Semiconductor International, Dec. 1, 2000, total pp. 5. (Spec., p. 5).

* cited by examiner

METHOD FOR THE PRODUCTION OF AN ELECTRONIC COMPONENT AND ELECTRONIC COMPONENT PRODUCED ACCORDING TO THIS METHOD

CROSS REFERENCE TO RELATED APPLICATIONS

This application is the National Stage of PCT/EP2010/063773 filed on Sep. 20, 2010, which claims priority under 35 U.S.C. §119 of German Application No. 10 2009 044 086.0 filed on Sep. 23, 2009, the disclosure of which is incorporated by reference. The international application under PCT article 21(2) was not published in English.

The invention relates to a method for the production of an electronic component and to an electronic component produced according to such a method.

In the case of electronic components having at least one semiconductor component on a semiconductor substrate, the waste heat that occurs in the semiconductor component during operation must be conducted away. This is particularly important for high-frequency power components. The at least one component, or typically a monolithically integrated circuit containing a plurality of components, is configured on the front side of the substrate, and the waste heat is conducted away through the substrate, by way of its back side, to a heat sink, and given off by way of a surface of a housing of the component, for example. The substrates frequently have openings that pass through from the back side to the front side of the substrate, which openings serve as electrically conductive through-connections from a planar back-side metallization to conductor surfaces on the front side of the substrate. Poor heat conduction between the substrate and the heat sink can lead to functional problems or failures of the component during operation.

In conduction of the waste heat from the semiconductor component that forms the waste heat source to the heat sink, a good heat-conductive connection of the metallized substrate back side with the heat sink therefore has particular significance.

Typically, a gold (Au) layer is deposited on the back side of the substrate, whereby an adhesion-imparting layer, which can contain Ge, Ti, W, Pd, or Cr, for example, is usually applied for a firm connection of the Au layer with the surface of the semiconductor substrate, and the Au layer is deposited on this layer, preferably galvanically. The surface of the Au layer that faces away from the substrate is soldered to the heat sink, whereby typically, a eutectic $AuSn_4$ alloy, particularly in the form of a thin pre-form film, is used as the solder. The surface of the heat sink that faces the substrate or the pre-form film typically also has an Au surface. The soldered connection between substrate and heat sink is susceptible to the formation of cavities that impair the heat transfer, particularly on the side of the substrate. The parameters of the soldering process must be adhered to with close tolerances, in terms of time and temperature, in order to keep defects in the soldered connection as low as possible.

U.S. Pat. No. 7,339,267 B2 describes a method for the production of a semiconductor component soldered onto a support, on the back side of which, after a galvanically produced Au conductive layer having a thickness of 3000 nm, in addition a barrier layer composed of 300 nm Ti and 600 nm NiV, and after this, a final Au layer having a thickness of 500 nm, are deposited. In a soldering process that is performed in an inert gas atmosphere, in order to prevent oxidation, a solder pre-frame containing Sn is connected with back-side metallization, whereby the final Au layer alloys with the solder, but the barrier layer prevents dissolution of Au out of the thick Au conductive layer. In the barrier layer, Ti forms a strongly adhesive connection with the thick galvanic Au layer, and NiV prevents the spread of the Ti, which has a strong tendency to diffuse into Au. The barrier layer and the final Au layer are also deposited in pass-through holes and at edges of the Au conductive layer.

A back-side metallization with a barrier layer and a final Au layer is known from DE 196 32 635 A1, for a light-emitting semiconductor component, whereby a window is left in the final Au layer, below the active semiconductor region, in order to prevent a mechanical connection during soldering at this location, and to reduce mechanical stresses. In EP 1 850 400 A1, a light-emitting component having a soldered back-side metallization is described, in which the back-side metallization contains, after a conductive layer, a Ti barrier layer and an Au auxiliary layer that serves for soldering.

U.S. Pat. No. 5,027,189 shows a semiconductor structure on a GaAs substrate having pass-through holes, in which layers of a back-side metallization are also deposited. These particularly comprise a thick Au conductive layer and, after this, a barrier layer composed of Ni. A final Au layer, which serves for soldering, is selectively deposited only outside the pass-through holes, so that during the soldering process, wetting and alloying of the solder takes place only outside of the pass-through holes, on the final Au layer.

In a semiconductor component known from US 2003/0020174 A1, a pass-through hole is metallized with a Ti—Au—Au layer, from the active component side, before the substrate is thinned and a back-side metallization is applied, which contains a barrier layer for preventing the penetration of solder into the pass-through hole.

In the conference contribution "How to Process the Backside of GaAs Wafers" by Varmazis et al. in Semiconductor International, Dec. 1, 2001, problems and methods of back-side metallization of semiconductor substrates with through-connections are discussed. In order to prevent filling of the through-connections with the melted AuSn solder, which leads to mechanical stresses, it is proposed to cover the surface of the Au layer of the back-side metallization with an additional layer composed of Ti, Ni, or Cr, and to remove this additional layer again, by means of a photo mask and an etching process, on the planar surface of the back-side metallization, outside of the through-connections, and to expose the gold surface of the Au layer once again. After the photo mask is removed, the surface is provided by the additional layer in the pass-through holes, which surface oxidizes and can be wetted only poorly with the AuSn solder.

The present invention is based on the task of indicating a method for the production of a component having a soldered connection formed by way of an Au layer and an AuSn solder, between a substrate having metallized pass-through holes, and a heat sink, as well as a component produced according to such a method.

Solutions according to the invention are described in the independent claims. The dependent claims contain advantageous embodiments of the invention.

What is essential, for one thing, is the division of the back-side metallization into a first and a second Au layer and an intermediate layer that lies between these, which layer consists of a material different from Au and Sn, and forms a diffusion barrier for Sn into Au, and thereby prevents the penetration of Sn from the melted AuSn solder into the first Au layer. The intermediate layer, which is also referred to as a barrier layer below, advantageously consists, for this purpose, at least in part of a material that does not dissolve in the liquid AuSn phase that forms in place of the second Au layer, during the soldering process. Solubility of the material of the intermediate layer in the liquid AuSn phase to an extent that is small enough to be ignored for the barrier function and does not impair the impermeability of the intermediate layer for preventing the spread of the liquid AuSn phase into the first Au layer, should be understood as being equivalent to non-solubility in the sense of the barrier function. The intermediate layer can particularly contain at least predominant amounts of one or more of the materials composed of Ti, W, Mo, Ta, also in the form of chemical compounds of these materials, such as TiN, for example, and advantageously consists at least predominantly, preferably entirely of Ti and/or TiN. The second Au layer is advantageously significantly thinner than the first Au layer, so that the first Au layer extensively determines the mechanical, thermal, and electrical properties of the back-side metallization. The thinner second Au layer is advantageously converted completely and uniformly into an Au—Sn alloy during the soldering process. The layer thickness of the second Au layer advantageously amounts to not more than 160 nm, particularly not more than 120 nm, preferably not more than 90 nm.

In this connection and in the following, also as a special case, the non-eutectic intermetallic phases of metal mixtures are understood to be an alloy. Diffusion is understood to be both diffusion of a material through a solid and mixing of substances in liquid phases. The chemical elements are referred to by their chemical abbreviations from the periodic system, unless explicitly stated otherwise.

The intermediate layer, which is also referred to as a barrier layer below, can advantageously also reduce diffusion of contaminants from the thicker, preferably galvanically deposited first Au layer, particularly also diffusion out of an adhesion-imparting layer, which contains Ge, for example, between the first Au layer and the semiconductor substrate, into the second Au layer and toward its surface, in the planer contact surface of the back-side metallization to the AuSn solder pre-form, and reduce wetting problems caused by such diffusion. For this purpose, the intermediate layer advantageously possesses a diffusion resistance to such contaminants that is greater than that of the first Au layer.

It is furthermore significant that in the case of the substrates having pass-through holes that are affected by the invention, on the side walls of which holes the back-side metallization is deposited, the second Au layer is deposited anisotropically, with a lesser layer thickness, on average, on the side walls of the pass-through holes than on the planar back-side surface on which the solder pre-form is applied. The reduced layer thickness on the side walls of the pass-through holes can advantageously be selected to be so slight that in the case of treatment of the metallized substrate at an elevated temperature, material from the intermediate layer diffuses into the second Au layer, which is thin on the surface of the pass-through holes, to such an extent that this material reduces the wetting of the Au surface with the AuSn solder there, so greatly that no melted solder penetrates into the pass-through holes. The average layer thickness of the second Au layer on the side walls of the pass-through holes, in their half facing the front side, advantageously amounts to less than 40 nm.

Advantageously, the layer thickness of the second Au layer is less than the layer thickness of the intermediate layer. The treatment of the metallized substrate at an elevated temperature is advantageously provided by the soldering process, particularly by the beginning of the soldering process, during which the substrate is heated to the melting temperature of the AuSn solder. A different or separate temperature treatment step can also be carried out for this desired diffusion. In this connection, Ti, which oxidizes quickly at the Au surface, because of a strongly negative formation enthalpy of oxidation, in the temperature range of the soldering process, and is known as a means for preventing solder wetting as such, is particularly advantageous as a material of the intermediate layer. For this purpose, the soldering process advantageously takes place in an atmosphere that contains oxygen. An oxidation step that precedes the soldering process can also be provided, then preferably as a diffusion and oxidation step. Ti advantageously demonstrates a great increase in diffusion through the second Au layer, which can be ignored at lower temperatures, between 250° C. and 350° C. and thus in the temperature range of the soldering process. Other substances having strong diffusion through the second Au layer and, if applicable after oxidation, a wetting-reducing effect, in the temperature range of the soldering process, can also be used in the intermediate layer for this effect. Because of the greater thickness of the second Au layer, and because of the rapid wetting by the AuSn solder pre-form film that makes direct contact there, the influence of Ti diffusion does not make an appearance on the planar contact surface of the back-side metallization, or not to a noteworthy extent, so that there, an essentially complete planar soldered connection and thus good heat conduction from substrate to heat sink are formed. Photolithographic structuring of individual layers is not necessary.

The invention advantageously allows soldered connections between the heat sink and the back-side metallization of the substrate with low-interference, good heat conduction from substrate to heat sink. The soldering process is easy to control and allows greater variation of the process parameters than without the intermediate layer.

In a further development, the intermediate layer can be composed of multiple materials, which can also form different partial layers of the intermediate layer, whereby a first intermediate layer material does not dissolve in the liquid AuSn phase and prevents spreading of the liquid AuSn phase that occurs during the soldering process, in place of the second Au layer, into the first Au layer, and is present in the intermediate layer for this purpose in a sufficient thickness of advantageously at least 100 nm, particularly at least 150 nm, preferably at least 200 nm, and a second intermediate layer material diffuses into the surface of the second Au layer on the side walls of the pass-through holes in the case of treatment at an elevated temperature, particularly the soldering process itself, and reduces their wettability for the melted solder.

For example, the intermediate layer can be composed of a TiN/Ti layer sequence, in which the TiN partial layer reliably prevents the spread of the liquid AuSn phase into the first Au layer, and material diffuses out of the Ti partial layer, through the solid second Au layer, at its surface, and reduces wettability there. In this case, the Ti partial layer can also be structured to be thinner, and, particularly at uneven spots, can actually have gaps, because the barrier function is fulfilled by the TiN layer.

The invention will be demonstrated in greater detail below, using preferred examples, making reference to the figures. These show.

Figure 1:
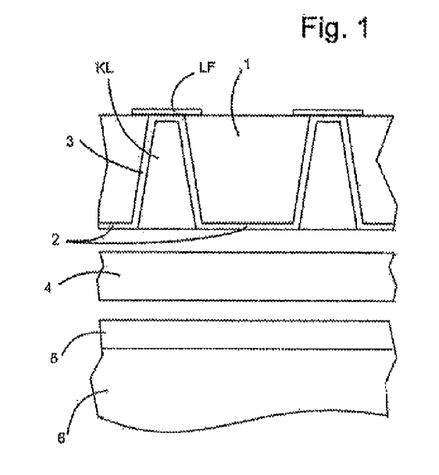
FIG. 1 a representation of components to be soldered to one another.

In FIG. 1, the relative arrangement of a substrate 1 with back-side metallization 2, a solder pre-form 4 and a module support 6 as a heat sink is shown as a sectional representation. The thinned semiconductor substrate 1 carries conductor surfaces LF, for example for contacting component connectors and/or for connecting multiple components with one another, on its front side VS, in which one or more semiconductor components can also be disposed as sources for waste heat that occurs during operation. On the back side RS of the substrate 1, a back-side metallization is deposited, which extends as a through-connection 3 also along the side walls of contact holes KL, which run through between the back side RS and the front side VS of the substrate, all the way to the conductor surfaces LF on the front side VS. The metallizations 2 and 3 are typically deposited together.

The surface of the back-side metallization 2 that faces the solder pre-form 4 or the module support 6 that forms the heat sink is typically formed by a gold (Au) surface. In general, the back-side metallization 2, which possesses a thickness of approximately 4,000 nm, for example, consists completely of Au, to a great extent, which is preferably deposited galvanically. In general, an adhesion-imparting layer and an Au starting layer as a so-called seed layer are deposited on the semiconductor surface of the back side RS of the substrate and the walls of the pass-through openings KL, which layer improves the adhesion of the Au layer on the semiconductor material and forms the growth layer for the galvanic reinforcement.

The solder pre-form is typically formed by a planar film that consists of a eutectic Au—Sn alloy with 80% Au and 20% Sn. The solder pre-form is assumed to be homogeneous in material, in itself.

A further metallization layer is deposited on the surface of the module support 6 that faces the solder pre-form 4 or the semiconductor substrate 1, which layer in turn consists at least predominantly of gold and possesses an Au surface that faces the solder pre-form.

For the production of a good heat-conductive soldered connection between the substrate 1 and the module support 6, for conducting away waste heat that occurs in the substrate 1 during operation of the at least one semiconductor component integrated into the substrate, to the module support 6 as a heat sink, the substrate is laid against the one side of the solder pre-form 4 with the back-side metallization 2, and the module support 6 is laid against the opposite side with the further Au layer 5, and they are heated to a temperature that suffices to melt the Au—Sn solder of the pre-form 4. The melting temperature of a eutectic Au—Sn solder lies at 278° C. The solder can also contain additives or contaminants, in addition to Au—Sn as the main component.

Figure 2:
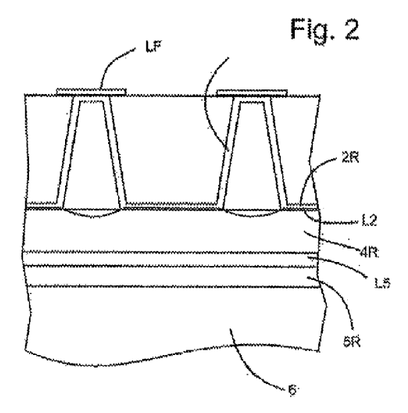
FIG. 2 the components, soldered without defects.

Au and Sn are well soluble in one another already at relatively low temperatures, in the liquid phase, according to the AuSn phase diagram, in the case of a eutectic $AuSn_4$ weight ratio, so that when the surfaces of the solder pre-form melt, gold from the back-side metallization 2 dissolves in the solder, and Sn from the solder dissolves in the Au of the back-side metallization 2. Layer-parallel transition regions 12 are formed, in which an Au—Sn alloy having a hypereutectic, i.e. more than 80% proportion of Au is present. After completion of the soldering process, a layer 2R of unalloyed Au remains, of the original Au layer of the back-side metallization 2, which layer generally still has the predominant thickness of the original layer thickness of the back-side metallization 2 if the soldering process was free of defects. In the region of the through-connections KL through the substrate, the solder ideally does not penetrate into these contact holes. An alloy layer L5 having a hypereutectic Au component also forms between the solder pre-form 4 and the further Au layer 5 on the module support 6. The solder layer that remains essentially unchanged is indicated with 4R, the residual layer of the Au layer 5 that remains essentially unalloyed is indicated with 5R.

Figure 3:
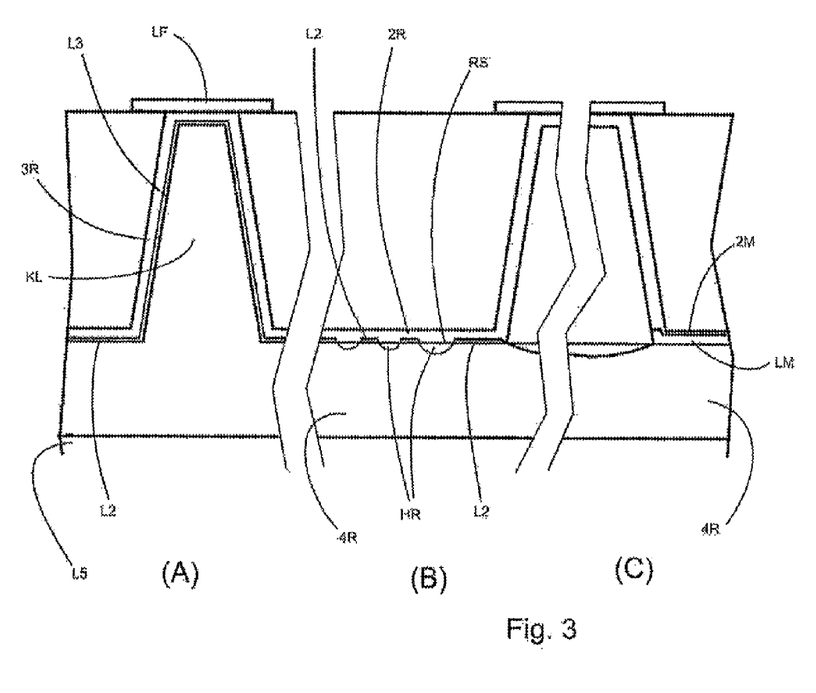
FIG. 3 typical defect situations.

As compared with the ideal result of defect-free soldering shown in FIG. 2, various defects can occur during the real soldering process, of which FIG. 3 shows three significant configurations.

In FIG. 3(A), a situation is shown in which liquid solder also has penetrated into the contact hole KL of the through-connection during the soldering process, and essentially fills it. Analogous to the alloy layer L2 between the Au residual layer 2R on the back side of the substrate, an alloy layer L3 forms between an Au residual layer 3R and the solder 4K that fills the through-connection, on the Au surface of the metallization layer 3, on the side walls of the through-connection KL. Because the contact hole is filled with solder, thermomechanical stresses can occur during operation, which can destroy the substrate or parts of it and can make the component unusable.

FIG. 3(B) shows a defect form in which the Au surface of the back-side metallization 2 remains unwetted by melted solder in surface sections NB when the solder of the solder pre-form 4 melts, and gas inclusions HR are formed, which lead to remaining cavities after the solder solidifies. A metallic transition between the substrate and the module support then occurs, on the back-side metallization of the substrate, only at the surface regions that have been wetted with solder, on which the alloy layer L2 forms between the Au residual layer 2R and the solder, while the non-wetted surface regions NB make practically no contribution to conducting heat away. Locally or in the entire circuit, impermissibly great heating can occur during operation of the semiconductor component, and therefore the functionality and the useful lifetime of the circuit on the substrate can be reduced.

In FIG. 3(C), a defect situation is shown, in which the alloy layer LM that forms during the soldering process, between the solder of the solder pre-form 4 and the Au layer 2 of the back-side metallization, assumes a great depth within the original Au layer 2, and can reach close to or all the way to the substrate. In FIG. 3(C), a thin Au residual layer 2M of the original Au layer 2 is still shown, while the alloy layer LM having a hypereutectic Au component reaches close to the back side RS of the substrate. Because Au—Sn phases having a hypereutectic Au component are generally significantly more brittle than the pure metals or the eutectic alloy of the AuSn layer 4, the brittle properties of the alloy layer LM can result in loosening of the back-side metallization from the back side of the substrate, and because of this, in turn, the heat transfer from at least one component as a waste heat source on the front side of the substrate to the module support 6 as a heat sink is hindered, and overheating of the substrate or of the integrated component or circuit threatens.

The defect situation according to FIG. 3(A) can take place, for example, as the result of a measure mentioned in the prior art cited in the introduction, with wetting-reducing selective coating of the Au surface of the metallization layer 3 or surface-selective deposition of the second Au layer 25 nm on the planar back-side surface of the intermediate layer. The formation of cavities HR according to FIG. 3(B) by means of non-wetted surface regions NB can be reduced, in part, by means of higher temperatures during the soldering process. However, higher temperatures during the soldering process disadvantageously reinforce the occurrence of defect situations according to FIG. 3(C), because with an increasing temperature, particularly at temperatures above 300° C.

according to the AuSn phase diagram, the reciprocal solubility of Au and Sn in a non-eutectic mixture ratio increases greatly.

Figure 4:
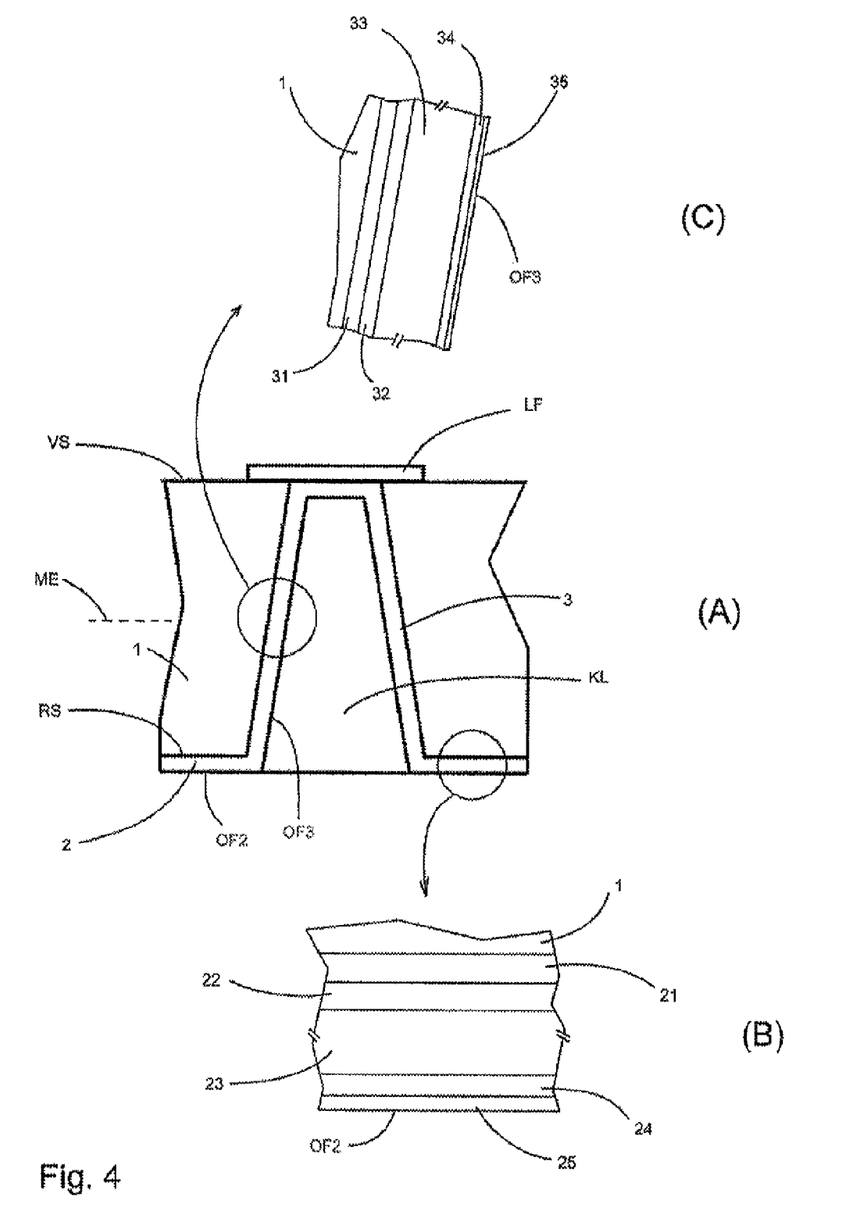
FIG. 4 a back-side metallization according to the invention.
Figure 5:
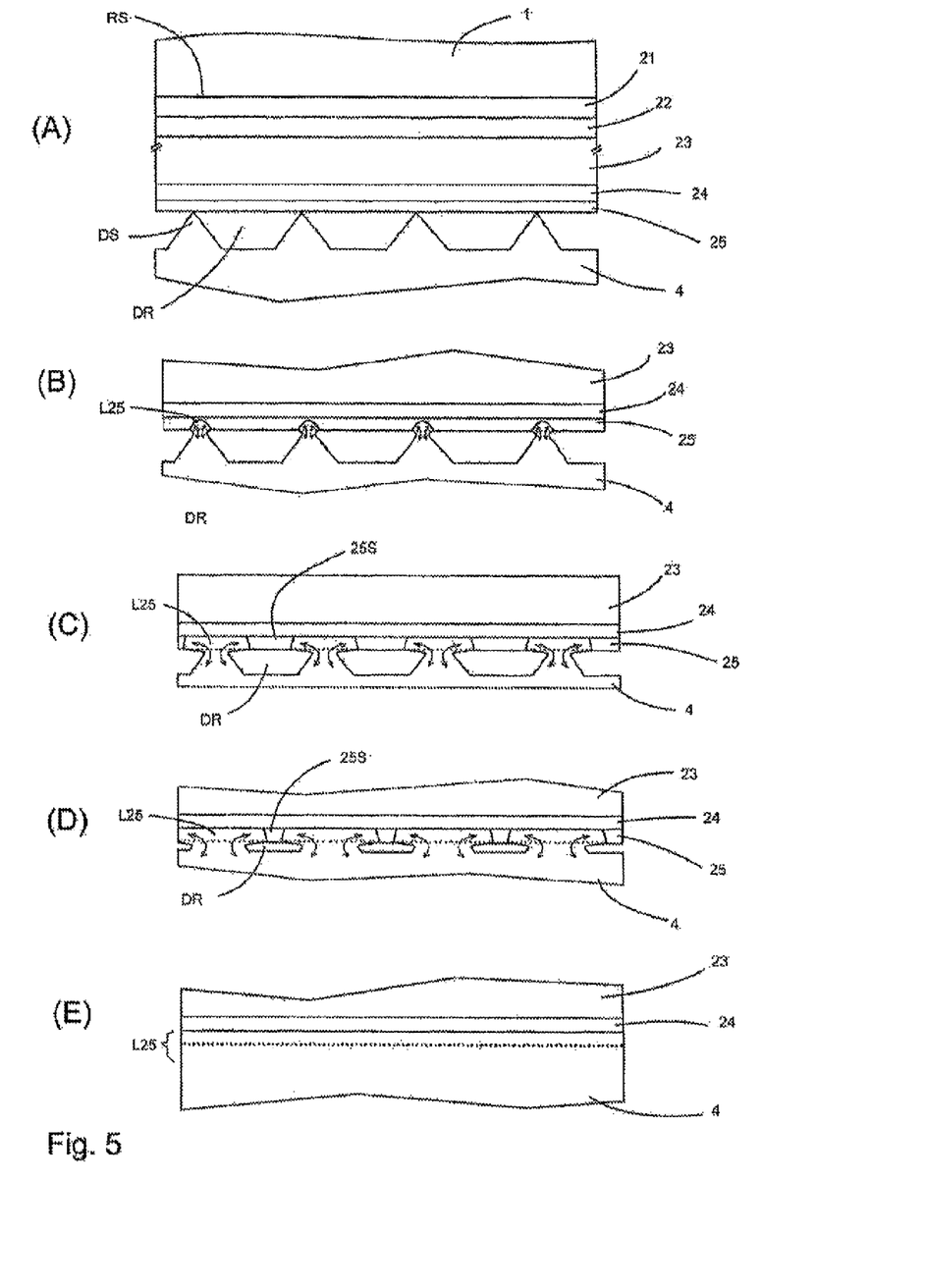
FIG. 5 a soldering process with the metallization according to FIG. 4.

The invention provides for a modified structure of the back-side metallization, which is explained in greater detail using FIGS. 1A and 5, using a preferred exemplary embodiment. In this connection, FIG. 4(A) once again shows the structure of a substrate coated on the back side with a back-side metallization 2, without details, whereby this back-side metallization continues along side walls of through-connections, as a metallization layer 3, all the way to conductor surfaces LF on the front side VS of the substrate. An enlarged detail of the back-side metallization 2 is shown in FIG. 4(B); an enlarged detail of the metallization layer 3 along the side walls of the through-connections is shown in FIG. 4(C).

The back-side metallization 2, in agreement with conventional methods of procedure, shows an adhesion-imparting layer 21 on the back side RS of the substrate 1, which layer can consist of germanium, for example. On this layer, a metallic starting layer 22, preferably composed of Au, is applied, on which in turn a first Au layer 23 is deposited. The first Au layer 23 is preferably deposited galvanically and has a layer thickness of at least 2000 nm, typically approximately 3,500 nm. The relative layer thicknesses in FIG. 4 should not be considered as being to scale, particularly with regard to this first Au layer 23. In the case of the Au layer 23, interruptions in the lateral section edges are drawn in, as an indication of this.

An intermediate layer, also referred to as a barrier layer 24 below, is deposited on the Au layer 23, as an essential element of the invention. As the final layer of the layer sequence, a second Au layer 25 is deposited, which forms the Au surface that faces the solder pre-form 4.

The thickness of the barrier layer 24, on the back side of the substrate, advantageously amounts to at least 100 nm, particularly at least 150 nm, preferably at least 200 nm. The layer thickness of the second Au layer 25 advantageously amounts to maximally 160 nm, particularly maximally 120 nm, preferably maximally 90 nm.

The barrier layer 24 consists of a material that possesses practically no solubility with Au and, in particular, with Sn or a liquid Au—Sn phase having a hypereutectic gold component, in the temperature range of the soldering process, i.e. at approximately 280° C. to 380° C., and thereby essentially prevents diffusion of Sn that spreads in the second Au layer 25, through the barrier layer 24, into the first Au layer 23. In particular, spread of the liquid AuSn phase that forms in the second Au layer, into the first Au layer, is avoided.

Preferably, Ti is used as the material for the barrier layer. The barrier layer prevents diffusion of Sn out of the liquid Au—Sn phase, which forms in the second Au layer 25 after the solder pre-form melts, into the first Au layer 23. In this way, the formation of brittle Au—Sn phases in the vicinity of the substrate back side RS is reliably avoided. The formation of brittle phases is also reduced in the transition region of the second Au layer 25 and the solder pre-form 4, because only a relatively small amount of gold is available from the thin second Au layer 25, for the formation of an alloy having a hypereutectic Au component, and during the diffusion of Au from the second Au layer 25 into the Au—Sn solder and vice versa, an alloy having only a slight Au excess as compared with the eutectic alloy ratio is formed.

The barrier layer 24 advantageously additionally prevents the diffusion of contaminants out of the first Au layer 23 to the Au surface of the back-side metallization. This is particularly important in connection with the usual use of Ge in the adhesion-imparting layer on the substrate surface, because Ge demonstrates great diffusion through Au, particularly also through the thick first Au layer, already at relatively low temperatures, and oxidizes easily on the Au surface that faces away from the substrate, and reduces wettability. Because non-wetted surface regions NB of the Au surface of the back-side metallization are attributed to contaminants at the Au surface, the barrier layer thereby effectively prevents not only the defect situations according to FIG. 3(C), but also those according to FIG. 3(B), in simple manner.

The second Au layer 25 is advantageously deposited using a sputtering process, by means of which a particularly pure layer composition and, in particular, also a particularly low-contaminant Au surface of the back-side metallization can be achieved. The effect of the barrier layer 24 as a barrier against the diffusion of contaminants out of the first Au layer 23 to the Au surface of the second Au layer 25 preserves these advantageous surface properties of the Au surface of the back-side metallization.

In a particularly advantageous further development, it can be provided to use the material of the barrier layer 24 also for reducing defect situations according to FIG. 3(A), in that the diffusion of material out of the barrier layer to the Au surface of the metallization 3 on the side walls of the through-connections is promoted in targeted manner, in order to reduce the wettability with Au—Sn solder, as compared with a pure Au surface, on the Au surface, by means of material that gets onto the Au surface from the barrier layer. For this purpose, Ti, which quickly oxidizes to form titanium oxide when it reaches the Au surface, because of a strong negative formation enthalpy of oxidation, is particularly advantageously suited as a material of the barrier layer. The reduction in wettability by means of oxidized Ti is known from the prior art mentioned initially, in which the Au surface of the back-side metallization in the contact holes KL is provided with an additional Ti layer, in targeted manner, which layer is oxidized. While the use of an additional photolithographic mask is required in this prior art, in the present invention, a poorly wetting surface is achieved in the contact holes by means of diffusion of material, particularly Ti, from the barrier layer of the back-side metallization that has also been deposited in the contact holes, with the complete layer sequence, so that no additional masking and etching are required.

The wettability of the surface OF2 of the second Au layer 35 on the planar back side of the substrate is sufficiently maintained, because less material gets from the intermediate layer to these surface regions due to the significantly greater layer thickness. Local problems with wettability on the surface OF2 can be ignored, because sufficient connections are created by directly laying the solder pre-form 4 against the surface OF2, and surface regions of OF2 can also be integrated into the alloy layer L2 by means of back-flow.

Advantageously, when the back-side metallization is deposited, the second Au layer is anisotropically deposited, with a significantly lesser layer thickness, on average, in the metallization layer 3 on the side walls of the contact holes than in the region of the back-side metallization 2. In FIG. 4(C), a detail of the metallization layer 3 on the side walls of the contact holes is shown in greater detail, whereby once again, an adhesion-imparting layer 31, a metallic starting layer 32 on top of this, a first Au layer 33, preferably deposited galvanically, on this, after that a barrier layer 34, and as a final layer, a second Au layer 35 are deposited on the semiconductor surface of the substrate, on the side walls of the openings produced to pass through the substrate. The layers 31, 32, and 34 are typically also deposited anisotropically, particularly by means of sputtering, and are therefore also thinner than the corresponding layers 21, 22, and 24 of the back-side metallization 2. The layer thickness of the second Au layer 35 in the contact holes can be adjusted in such a manner, in the case of deposition by means of a sputtering process, by means of the process parameters, that it amounts to less than a third of the layer thickness of the second Au layer 25 in the back-side metallization 2 in the foot region of the pass-through holes close to the front side VS. The layer thickness of the second Au layer 35 typically decreases continuously from the back side RS in the direction of the front side VS or the conductor surfaces LF, on the side walls of the pass-through holes, in the case of a second Au layer 35 deposited by means of sputtering. Advantageously, the layer thickness of the second Au layer 35 amounts to not more than 50% of the layer thickness of the second Au layer 25 in the back-side metallization 2 on the back side of the substrate 1, preferably not more than 50 nm, at a center plane ME between the front side VS and back side RS of the substrate 1. As a result of the slight layer thickness of the second Au layer 35, diffusion of Ti from the barrier layer 34 to the Au surface OF3 of the second Au layer 35 is promoted, for one thing, when an elevated temperature is applied to the metallized substrate; for another, because of the slight layer thickness of the second Au layer 35 on the side walls of the through-connections, the spread of Sn out of the Au—Sn solder that is present at the connection between the layers 25 and 35 is significantly reduced. The surface of the second Au layer, which forms the contact surface for the solder pre-form 4, is indicated with OF2.

The second Au layer 35 in the region of the metallization 3 on the side walls of the contact holes advantageously has an average layer thickness of maximally 40 nm in the half that faces the front side VS of the substrate 1. The second Au layer 35 advantageously possesses a layer thickness of maximally 50 nm at a center plane ME that lies centered between front side VS and back side RS.

FIG. 5 schematically shows a possible initial sequence of a soldering process. A detail from the back-side metallization 2 and a surface of the solder pre-form 4 is shown. The surface of the solder pre-form 4 is typically significantly rougher than the Au surface 25 of the back-side metallization, as indicated by the peaks DS on the surface of the solder pre-form, on which the Au surface of the layer 25 of the back-side metallization initially supports itself. In the starting situation according to FIG. 5(A), no liquefaction of the Au—Sn solder is taking place, as yet, and the Au surface of the layer 25 predominantly lies freely between the points of the contact surfaces formed by the peaks RS, and is spaced apart from the surface of the solder pre-form 4 by a slight dimension, by means of clear spaces DR.

In FIG. 5(B), it is shown that the peaks RS of the solder pre-form that stand in point contact with the Au surface of the second Au layer 25 of the back-side metallization 2 melt. When this happens, Au from the layer 25 enters into a liquid phase with the melted Au—Sn solder, and dissolved Au diffuses out of the layer 25 into the Au—Sn solder of the pre-form, and, conversely, Sn diffuses out of the Au—Sn solder into the layer 25. The Au—Sn alloy having a hypereutectic proportion of Au that is formed when this happens is indicated with L25. The distance between the back-side metallization and the solder pre-form 4 is reduced as the result of melting of the peaks RS of the solder pre-form.

As the soldering process continues, dissolution of the metals of the second Au layer 25 and of the solder pre-form into one another furthermore takes place, with the formation of the Au—Sn alloy L25 as a liquid phase having a slightly elevated Au proportion as compared with the pure Au—Sn solder. Because spread of Sn beyond the layer 25 is prevented by the barrier layer 24, spread of the liquid alloy phase L25 takes place perpendicular to the plane of view only to the layer boundary toward the layer 24, and laterally in the layer plane. Because of the good wettability of the Au surface of the second Au layer 25, fast lateral spread of the liquid alloy phase L25 is strongly promoted. In the intermediate step according to FIG. 5(C), crosspieces 25S of the second Au layer 25 that have not liquefied yet are shown.

As the soldering process progresses, the remaining crosspieces 25S of the second Au layer 25 rapidly become narrower, as shown in FIG. 5(D). At the same time, the interstices DR rapidly disappear, as the result of the exchange of Au and Sn between the layer 25 and the solder pre-form 4, as symbolized by the curved arrows, until, in the ideal case according to FIG. 5(E), the Au layer 25 has been completely dissolved and a continuous alloy layer L25 has formed as a transition from the barrier layer 24 to the solder of the solder pre-form 4.

Advantageously, the soldering process itself can be utilized as a treatment of the substrate at an elevated temperature, for diffusion of Ti out of the barrier layer 34 of the metallization 3 to the surface OF3 on the side walls of the through-connections. The soldering process takes place at approximately 280° C. to 300° C. The diffusion of Ti through the second Au layer 35 that is brought about in this connection fundamentally makes its appearance, in corresponding manner, also in the case of the second Au layer 25, whereby there, however, in the process shown in FIG. 5, diffusion all the way to the Au surface OF3 of the layer 25 is greatly delayed because of the significantly greater layer thickness of the layer 25, as compared with the layer 35. Furthermore, the Au surface OF2 of the layer 25 already decreases at the beginning of the soldering process, with an increasing formation of alloy regions L25. Point-type regions with reduced wettability that might be present at the surface OF2 of the second Au layer 25, as the result of diffusion of Ti out of the intermediate layer 24, are covered by back-flow of the liquid AuSn phase, and are completely integrated into the alloy layer L25. The different wettabilities of the surfaces OF2 and OF3 can be adjusted, in targeted manner, by means of the thicknesses of the second Au layer 25, 35 and the temperature management during the soldering process and/or during a diffusion and/or oxidation process that might precede it.

Furthermore, as a result of the barrier effect of the layer 24 against the spread of the liquid AuSn phase into the second Au layer 23, the temperature and/or the treatment duration of the soldering process can be selected to be so great, without the risk of formation of brittle phases, that the proportion of defect situations of the type shown in FIG. 3(B) remains small enough to be ignored. The non-sensitivity of the metallization having the barrier layer to higher soldering temperatures and/or longer soldering times advantageously also opens up more freedoms in the parameters of the soldering process, so that components can be soldered into a common component housing, for example, also by way of other soldered connections having higher soldering temperatures and/or longer soldering times, in a soldering process with the AuSn/Au soldering compound.

The characteristics indicated above and in the claims, as well as those that can be derived from the figures, can advantageously be implemented both individually and in different combinations. The invention is not restricted to the exemplary embodiments described, but rather can be modified in many different ways, within the scope of the ability of a person skilled in the art.

The invention claimed is:

1. Method for the production of an electronic component having at least one semiconductor component that forms a waste heat source during operation, on the front side of a semiconductor substrate (1), wherein the back side (RS) that faces away from the component is provided with a back-side metallization (2) and is connected, in heat-conductive manner, with a heat sink (6), in a soldering process, using a solder layer (4) that contains Sn, and wherein a metallization (3) is deposited also on pass-through openings (KL) between front side and back side, through the substrate, wherein a first Au layer (23, 33), an intermediate layer (24, 34) composed of a material different from Au and Sn, and a second Au layer (25, 35) are deposited for the back-side metallization (2) and the metallization (3) of the pass-through openings (KL), one after the other, and wherein a material that forms a diffusion barrier for a liquid AuSn phase and prevents spread of a liquid AuSn phase formed during the soldering process, in place of the second Au layer, into the first Au layer, is selected for the intermediate layer, wherein the second Au layer (35) is deposited with a lesser thickness on the side walls of the pass-through openings, and the wettability for material of the solder layer is reduced at the surface (OF3), as compared with the thickness and wettability of second Au layer (25) on the back side of the substrate.

2. Method according to claim 1, wherein material from the intermediate layer (34) is diffused, at elevated temperature, through the second Au layer (35), toward the surface (0F3) of the second Au layer (35) on the side walls of the openings, as a material that reduces wettability.

3. Method according to claim 1, wherein material that diffuses out of the intermediate layer (34) to the surface (0F3) of the second Au layer (35) is oxidized there.

4. Method according to claim 1, wherein at least predominantly one or more of the materials Ti, W, Mo, Ta, or chemical compounds with these, preferably at least predominantly Ti, is/are selected for the intermediate layer (24).

5. Method according to claim 1, wherein the intermediate layer is deposited in the form of at least two partial layers.

6. Method according to claim 5, wherein for a first partial layer, TiN is selected, and for a second partial layer deposited between the first partial layer and the second gold layer, Ti is selected as an at least predominant material.

7. Method according to one claim 1, wherein the intermediate layer (24) is deposited on the substrate back side at a layer thickness of at least 100 nm, particularly at least 150 nm, preferably at least 200 nm.

8. Method according to claim 1, wherein the second Au layer (25) is deposited at a lesser layer thickness than the first Au layer (23).

9. Method according to claim 1, wherein the second Au layer is deposited at a layer thickness of less than 160 nm, particularly less than 120 nm, preferably less than 90 nm.

10. Method according to claim 1, wherein the second Au layer (25, 35) is deposited using a sputtering process.

11. Method according to claim 1, wherein the first Au layer (23) is deposited at a layer thickness of at least 2000 nm.

12. Method according to claim 1, wherein the second Au layer (35) amounts to not more than 50% of the layer thickness of the second Au layer (25) on the back side of the substrate, preferably not more than 50 nm, on the side walls of the openings at a center plane of the substrate.

13. Method according to claim 1, wherein the layer thickness of the second Au layer (35) on the side walls of the openings (KL) is deposited with a layer thickness that is less than 40 nm, on average, in the half of the pass-through openings that faces the front side.

14. Method according to claim 1, wherein the substrate having the back-side metallization is heated to a temperature of at least 280° C. before or preferably during the soldering process.

* * * * *